(12) United States Patent
Kurth et al.

(10) Patent No.: US 6,785,167 B2
(45) Date of Patent: Aug. 31, 2004

(54) ROM EMBEDDED DRAM WITH PROGRAMMING

(75) Inventors: Casey Kurth, Eagle, ID (US); Scott Derner, Meridian, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/174,746

(22) Filed: Jun. 18, 2002

(65) Prior Publication Data

US 2003/0231519 A1 Dec. 18, 2003

(51) Int. Cl.[7] .................................................. G11C 7/00
(52) U.S. Cl. .................... 365/189.01; 365/94; 365/104; 365/149
(58) Field of Search ............... 365/189.01, 44, 365/104, 149, 94, 102

(56) References Cited

U.S. PATENT DOCUMENTS

| | | | | |
|---|---|---|---|---|
| 4,575,819 A | * | 3/1986 | Amin | 365/104 |
| 5,406,516 A | * | 4/1995 | Ihara et al. | 365/189.01 |
| 5,418,739 A | * | 5/1995 | Takasugi | 365/149 |
| 5,432,742 A | * | 7/1995 | Ihara et al. | 365/189.01 |
| 5,526,302 A | * | 6/1996 | Takasugi | 365/149 |
| 6,134,137 A | * | 10/2000 | Kurth et al. | 365/149 |

* cited by examiner

*Primary Examiner*—Son Mai
(74) *Attorney, Agent, or Firm*—Leffert Jay & Polglaze, P.A.

(57) ABSTRACT

Programming efficiency of a read only memory (ROM) embedded dynamic random access memory (DRAM) is improved by programming only one polarity of bits in non-volatile cells of the ROM embedded DRAM, and then blanket programming volatile cells in the ROM embedded DRAM to represent the remaining bits.

37 Claims, 5 Drawing Sheets

ROM EMBEDDED DRAM WITH PROGRAMMING

FIELD

The present invention relates generally to memory devices, and more specifically to a read only memory (ROM) embedded in a dynamic random access memory (DRAM).

BACKGROUND

Memory devices are typically provided as internal storage areas in a computer or other electronic device requiring memory, such as cellular telephones, handhelds, and the like. There are several different types of memory. One type of memory is random access memory (RAM) that is typically used as main memory in a computer environment. Most RAM is volatile, which means that it requires a steady flow of electricity to maintain its contents.

A dynamic random access memory (DRAM) is made up of memory cells. Each cell of a modern DRAM includes a transistor and a capacitor, where the capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the access device is activated and sense amplifiers coupled to bit lines (column) determine the level of charge provided to or dumped onto the digit lines from the memory cell, and reads the charge out as either a "1" or a "0" depending upon the level of charge in the capacitor. In a write operation, the sense amplifier is over-powered and the memory cell capacitor is charged to an appropriate level.

Referring to FIG. 1, a DRAM memory cell 200 is illustrated. The cell 200 is illustrated as having a capacitor 202 and an access transistor 204. The capacitor 202 is used to store a charge. The charge represents a bit of information. The access transistor 204 acts as a switch for the capacitor 202. That is, the access transistor 204 controls when a charge is placed on the capacitor 202, and when a charge is discharged from the capacitor 202. A word line is coupled to a control gate of the access transistor 204. When a cell is read, the word line activates the control gate of the transistor 204. Once this happens, any charge (or lack of charge) stored on the capacitor 202 is shared with a conductive digit line coupled to the drain of the access transistor 204. This charge is then detected in the digit line by a sense amplifier and then processed to determine the bit state of the cell 200. Tiling a selected quantity of cells together, such that the cells along a given digit line do not share a common word line and the cells along a common word line do not share a common digit line, forms a memory array. A typical memory array contains thousands or millions of cells.

After a cell has been accessed, sensing occurs. Sensing is necessary to properly read the data and refresh the cells. A simplified illustration of a typical sense amplifier is shown in FIG. 2. As FIG. 2 illustrates, the sense amplifier includes a Psense-amp and a Nsense-amp. The Psense-amp includes a pMOS pair of transistors, and the Nsense-amp includes an nMOS pair of transistors. Also labeled in FIG. 2 is node ACT (for ACTive pull up) on the Psense-amp, and node NLAT* (Nsense-amp LATch) on the Nsense-amp. ACT and NLAT provide power and ground. Initially, NLAT* is biased to $V_{cc}/2$ and Act is biased to Vss or signal ground. Since, the digit line pair D0 and D0* are both at $V_{cc}/2$, the nMOS pair of transistors and the pMOS pair of transistors are turned off. When a cell is accessed that is coupled to either D0 or D0*, a voltage difference occurs between D0 and D0*. While one of the digit lines contains charge from the cell access, the other digit line serves as a reference for the sensing operation.

After the cell is accessed the sense amplifiers are generally fired sequentially, the Nsense-amp first, followed by the Psense-amp. The Nsense-amp is fired by pulling NLAT* toward ground. As the voltage difference between NLAT* and the digit lines approaches $V_{th}$, the nMOS transistor whose gate is connected to the higher voltage digit line begins to conduct. This conduction causes the low-voltage digit line to be discharged toward the NLAT* voltage. Ultimately, NLAT* will reach ground, and the digit line will be brought to ground potential. Sometime after the Nsense-amp fires, the Psense-amp is activated by bring the ACT toward $V_{cc}$. The Psense-amp operates in a complementary fashion to the Nsense-amp. With the low-voltage digit line approaching ground, there is a strong signal to drive the appropriate pMOS transistor into conduction. This conduction charges the high-voltage digit line toward ACT, ultimately reaching $V_{cc}$. The capacitor of the cell being read is refreshed during the sensing operation. This is accomplished by keeping the access transistor of the cell on when the Psense-amp is activated. The charge the capacitor of the cell had prior to accessing the cell is fully restored. That is, the charge will be restored to Vcc for a 1 bit and GND for a 0 bit.

One technique for physically programming ROM embedded cells in a DRAM array is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to $V_{cc}$ or $V_{ss}$ by shorting the cell to word lines. The memory reads the ROM cells in a manner that is identical to reading the DRAM cells.

It would be desirable to improve the read and write efficiency and to simplify the read and write process for a ROM embedded DRAM.

SUMMARY

In one embodiment, a ROM embedded DRAM includes a memory array having a first portion of ROM cells and a second portion of DRAM cells. The ROM cells include a number of DRAM cells hard shorted to one ROM bit polarity, and the remaining DRAM cells programmable to an opposite ROM bit polarity.

In another embodiment, a ROM embedded DRAM includes a DRAM array having a first subarray containing bits identified as ROM (or nonvolatile) bits and a second subarray having DRAM (or volatile) bits. In the ROM bit section of the ROM embedded DRAM, ROM bits of a first polarity are hard shorted to a first ROM bit polarity, and ROM bits of a second, complementary polarity remain as DRAM cells within the ROM bit section, and are programmed as DRAM bits to the second polarity.

In yet another embodiment, a method of programming a ROM section of a ROM embedded DRAM includes hard programming all non-volatile cells of one polarity to their values, and blanket programming all volatile cells of the ROM section to the opposite polarity.

In yet another embodiment, a dynamic read only memory (DROM) includes first memory cells programmed in a non-volatile manner to a first data state, and second memory cells dynamically programmed to a second data state, wherein the second memory cells comprise capacitors.

Other embodiments are described and claimed.

DETAILED DESCRIPTION

Figure 1:
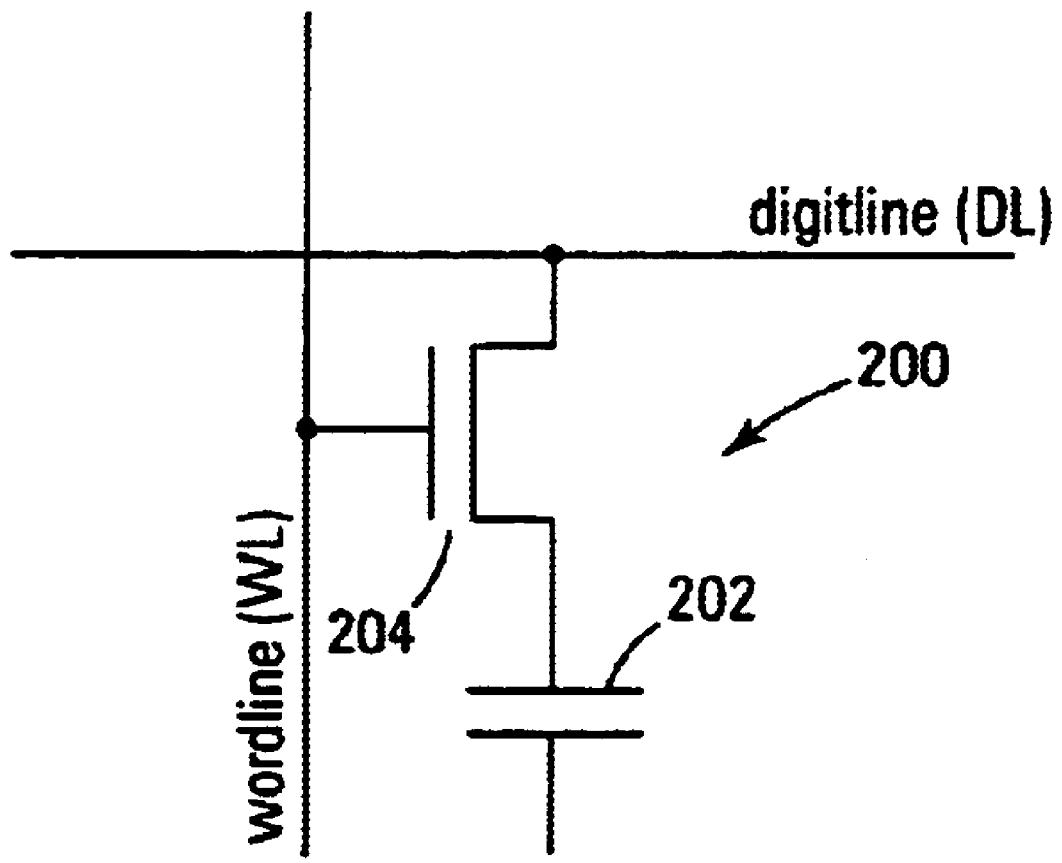
FIG. 1 is a diagram of a typical DRAM memory cell.
Figure 2:
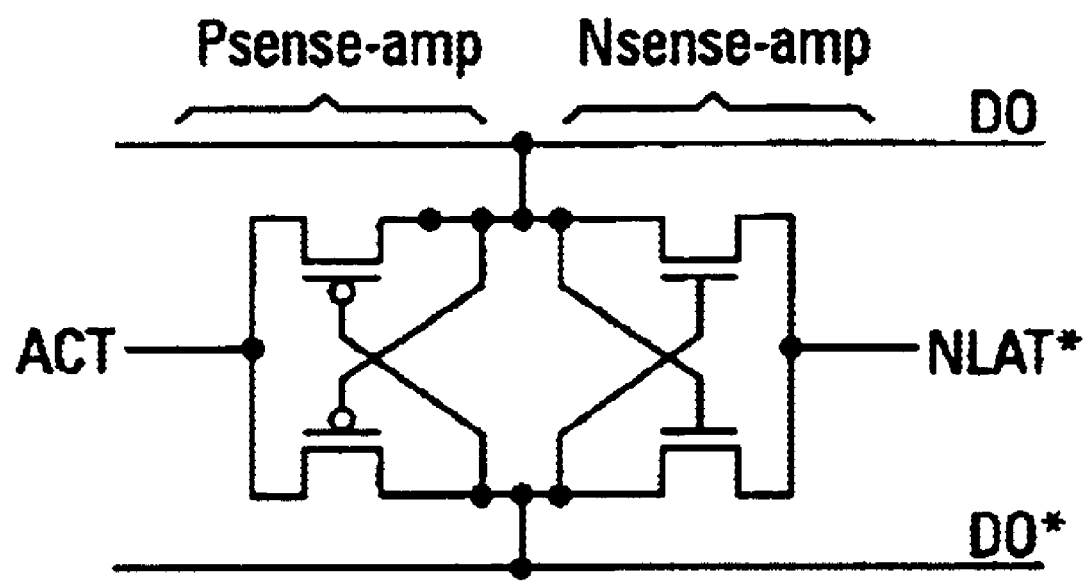
FIG. 2 is a circuit diagram of a sense amp configuration.

In the following detailed description of the embodiments, reference is made to the accompanying drawings which form a part hereof, and in which is shown by way of illustration specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 3:
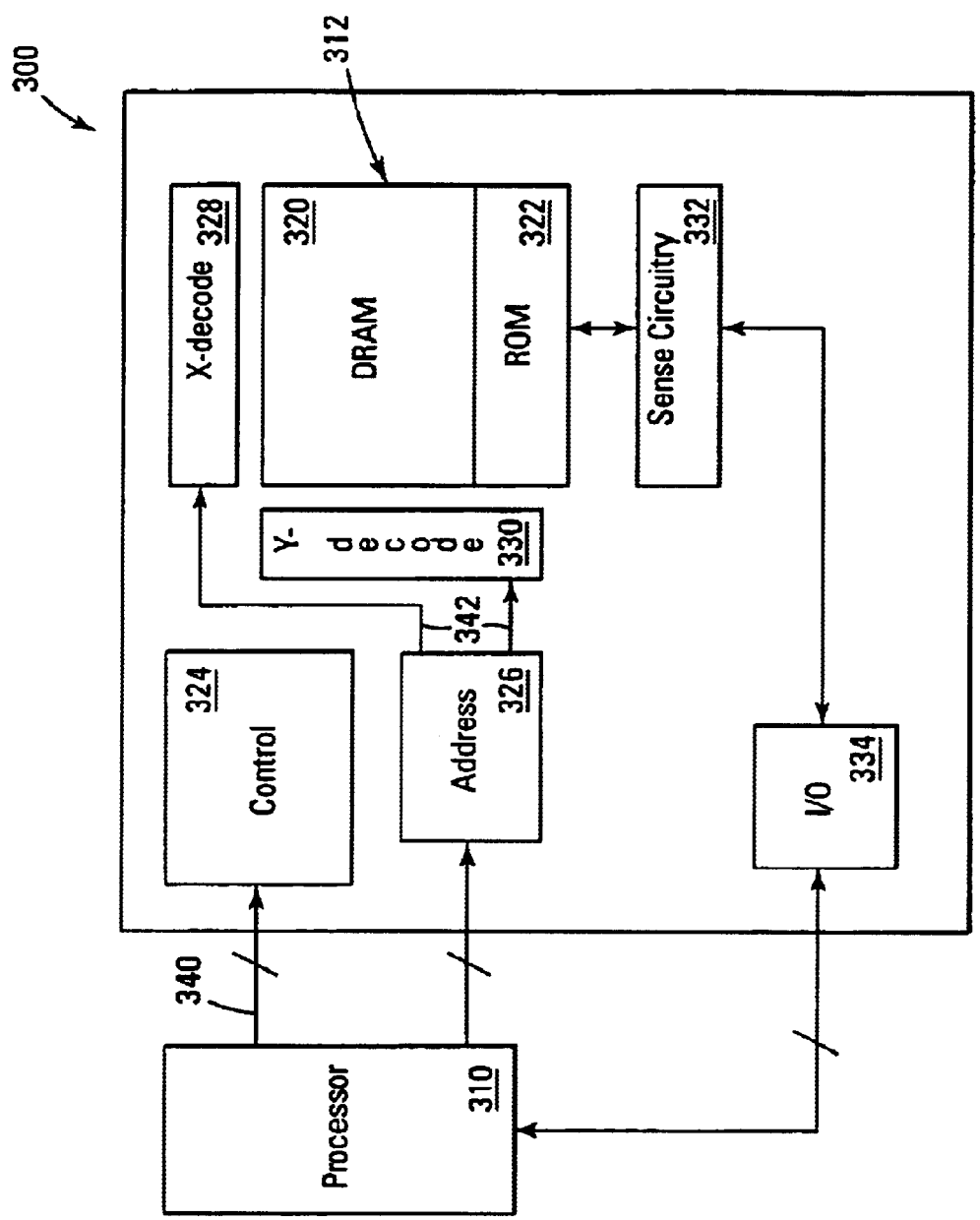
FIG. 3 is a block diagram of a ROM embedded DRAM on which embodiments of the present invention are practiced.

Referring to FIG. 3, a simplified block diagram of a ROM embedded DRAM 300 of the present invention is described. The memory device can be coupled to a processor 310 for bi-directional data communication. The memory includes an array of memory cells 312. The array includes a dynamic (DRAM) portion 320 and a read only (ROM) portion 322. The ROM array is "embedded" in the dynamic memory and may include some dynamic cells. Control circuitry 324 is provided to manage data storage and retrieval from the array in response to control signals 340 from the processor. Address circuitry 326, X-decoder 328 and Y-decoder 330 analyze address signals 342 and storage access locations of the array. Sense circuitry 332 is used to read data from the array and couple output data to I/O circuitry 334. The I/O circuitry operates in a bi-directional manner to receive data from processor 310 and pass this data to array 312. It is noted that the sense circuitry may not be used in some embodiments to store the input data.

Dynamic memories are well known, and those skilled in the art will appreciate that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding non-volatile ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded memory.

One technique for physically programming ROM embedded cells is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to $V_{cc}$ or $V_{ss}$ by shorting the cell to word lines. The memory reads the ROM cells in a manner that is identical to reading the DRAM cells. As described below, the present invention provides an improved ROM embedded DRAM.

Figure 4:
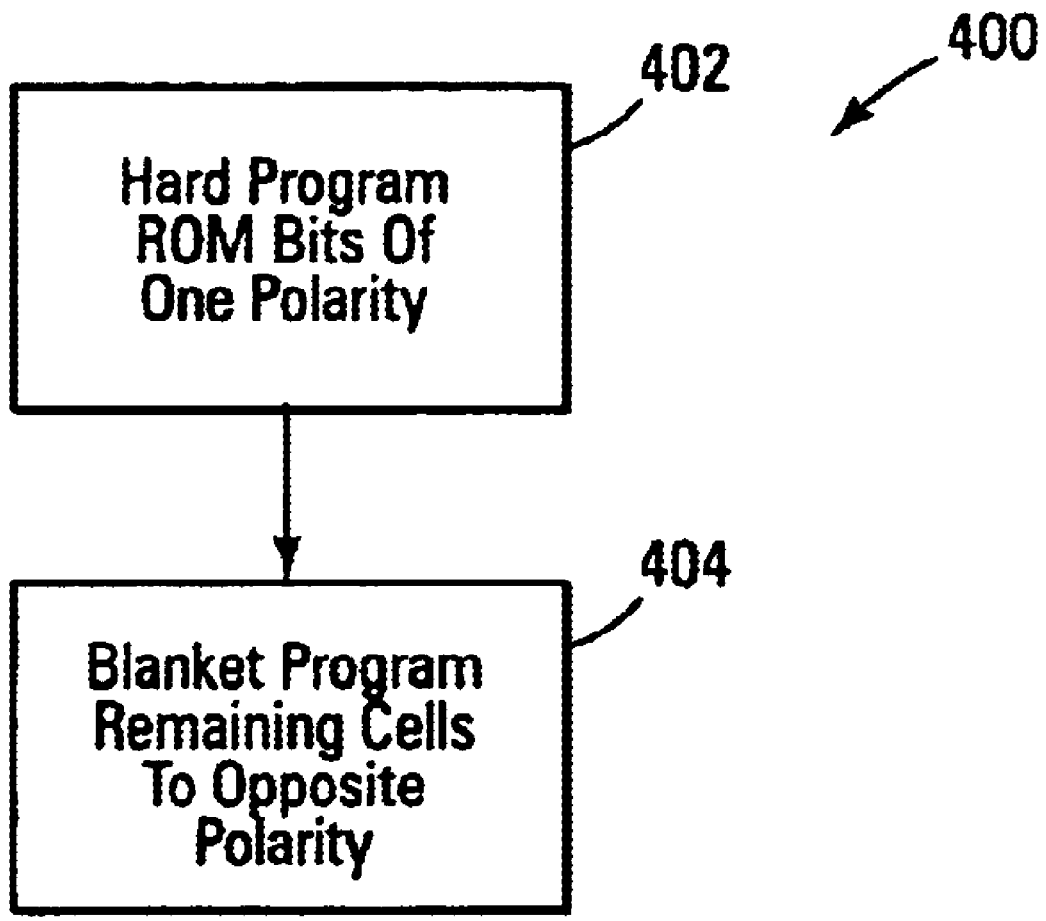
FIG. 4 is a flow chart diagram of a method according to one embodiment of the present invention.

Referring to FIG. 4, a method of initializing a non-volatile ROM portion of a ROM embedded DRAM comprises hard programming in the ROM section of a ROM embedded DRAM all the non-volatile bits of a particular polarity in block 402, and blanket programming the remaining volatile cells in the ROM portion of the ROM embedded DRAM to the opposite polarity of the hard programmed non-volatile bits in block 404.

Non-volatile bits each have a polarity, or value, of logic 1 or logic 0. These values are typically represented in a non-volatile, or ROM, cell by a hard wired short to a logic 1 or a logic 0 value. Various programming methods to short non-volatile cells in a ROM embedded DRAM are known, and are amenable to the embodiments of the present invention. Hard shorting a cell to a specific logic value is accomplished, by way of example only and not by way of limitation, In the method 400, if the non-volatile cells that are hard programmed are all those non-volatile cells which are to be logic 1 value non-volatile bits are programmed to a hard 1, the remaining portion of the ROM section is left as unprogrammed volatile cells. Once the hard programming is complete, the array, that is the portion of the ROM embedded DRAM that contains programmed non-volatile cells, is blanket programmed using normal DRAM write techniques to logic 0 values. The hard shorted non-volatile bits will overcome the 0 logic programmed by the DRAM write, and will remain as logic 1 bits. The volatile cells of the ROM portion of the ROM embedded DRAM will be programmed to logic 0. Thus, all of the cells in the ROM portion of the ROM embedded DRAM are properly programmed. The volatile cells in the ROM portion that have been programmed to logic 0 may need to be occasionally refreshed in order to maintain their logic 0 value.

In the alternative, the non-volatile cells that are hard programmed could be programmed to a hard 0. The rest of the array is left as unprogrammed volatile cells as before. The DRAM array, non-volatile cells included, is then blanket programmed to all ones. The hard shorted bits leak immediately to zeros, and the volatile cells are programmed to all ones. However, in this situation, in a typical DRAM configuration, the volatile cells programmed to ones in the blanket programming will eventually leak to zero, so they must occasionally be refreshed as in a standard DRAM. In one embodiment, all the cells in the array are refreshed according to the specifications for a DRAM. In another embodiment, a redundant array or other lookup table stores information on which cells are hard programmed and which cells need refreshing. However, this may be impractical in modem memory design, and is unnecessary due to the hard programming which will overcome any DRAM programming for the cells that are hard programmed.

Refreshing is known in the art, and will not be discussed further herein. It should be understood that refresh rate is a function of the type of cells that are to be refreshed, that is refreshing for logic 0 values does not typically need to be performed as often as refreshing for logic 1 cells, since a grounded cell does not change state as quickly as a cell which is pulled high. However, in a different type of DRAM, the opposite may be true, and the principles of the present invention apply equally well.

In this configuration, then, the ROM portion of the DRAM need only have one of the polarities of its non-volatile bits hard wired or programmed. Then, the remaining cells, which are left as volatile cells, are blanket programmed to the other polarity.

In another embodiment, because it is not necessary to blanket program all of the volatile cells in the ROM portion of the ROM embedded DRAM, since some of the cells are hard programmed as non-volatile cells after hard programming, only those cells in the ROM portion of the ROM embedded DRAM that are not hard programmed (that is, the volatile cells) are written to in a write operation. For example, if all the logic 1 polarity non-volatile bits in the ROM embedded DRAM have been hard shorted, the only cells that need to be programmed to logic 0 are those cells that have not been hard programmed. Write operations do consume power. In this embodiment, only those volatile cells in the ROM portion of the ROM embedded DRAM that are to be logic 0 cells are written as logic 0 cells. The remaining cells, those that have been hard programmed to logic 1 values, are not programmed.

Figure 5:
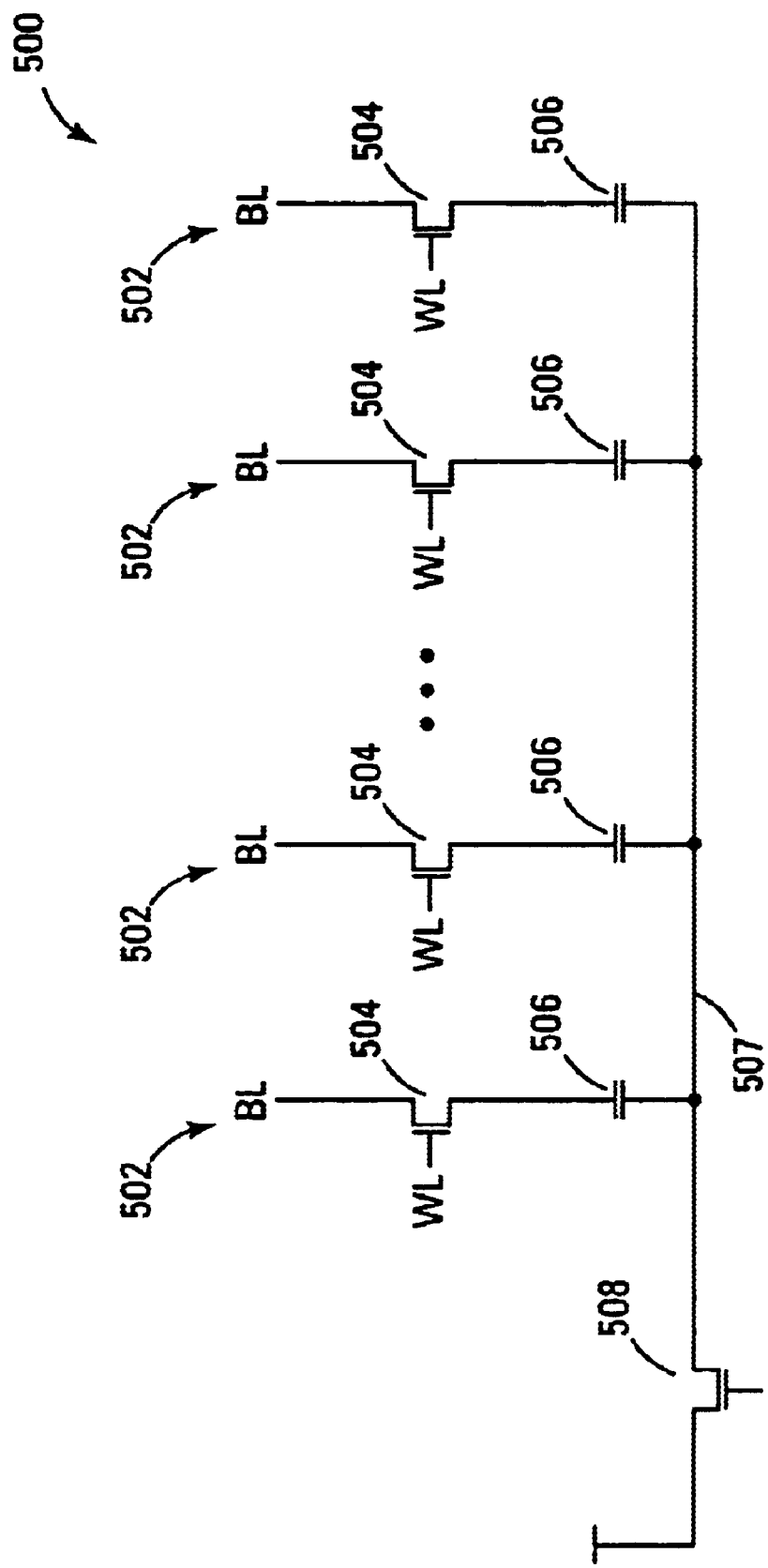
FIG. 5 is a circuit diagram of a ROM array according to another embodiment of the present invention.

In another embodiment 500 shown in FIG. 5, a ROM embedded DRAM array 500 comprises a plurality of memory cells 502. Each memory cell 502 comprises in this embodiment a 1T1C cell of access transistor 504 and storage capacitor 506. The capacitor ground plate of each capacitor 506 that represents a hard programmed nonvolatile ROM bit is connected to a common conductor 507 operatively connected to a supply voltage such as $V_{cc}$ or the like. An isolation transistor 508 selectively couples capacitors 506 to the supply voltage. During a blanket programming phase to dynamically program DRAM cells in the ROM portion, the isolation transistor 508 is turned on to isolate the cells 502 that are non-volatilely programmed. During a read operation, the transistor 508 is turned off and cell reading operates as normal.

In operation, during fabrication, an extra isolation transistor is fabricated and connected between the conductor plate and the supply voltage for programming a row of memory cells. This extra isolation transistor is enabled to allow a row of cells to be isolated during a programming operation, such as a write or refresh operation. In a ROM section, there is often large blocks of cells that are all programmed alike, and in some instances entire rows have the same programming. When such rows exist, and are hard programmed to a certain polarity, there is no need to refresh the row since all of its cells are hard programmed. In this instance, the row is isolated by the isolation transistor such as a transistor 508 from a write or refresh operation. This saves current since the write or refresh operation does not expend current on hard programmed rows of cells.

The extra isolation transistor is enabled to allow a supply voltage to pass to a row of capacitors if the row has been hard shorted during fabrication. This reduces the current required for a write or refresh operation wince the row does not need programming anyway.

When a read operation is to be undertaken, each isolation transistor such as transistor 508 is turned off, to allow sensing and reading of the bit programmed into each cell. Once a read is completed, and until another read operation begins, the isolation transistors 508 for those hard shorted ROM bit rows are turned on, and no refresh current is expended on already programmed cells which do not need to be refreshed.

The embodiments of the present invention are implemented in typical DRAM array fashion, that is with word and bit lines, and with sense amplifiers and the like to read and write cells. In operation, after the hard shorted ROM bits are programmed, the DRAM cells that represent the remaining ROM bits of the ROM embedded DRAM are programmed to the opposite polarity. This is accomplished through a precharge operation the first time the cells are programmed, and a refresh operation for subsequent programming. The cells that are programmed in a non-volatile manner are isolated so that no current is used in an attempt to program already non-volatilely programmed cells. When the precharge or refresh operation is initialized, and charging takes place, the current drain for cells which are hard programmed is eliminated by the isolation of the hard shorted ROM bits.

The methods and processes by which the ROM cells of the ROM portion of the ROM embedded DRAM cells are hard programmed is unimportant, and can be performed in many ways. ROM bits are hard programmed in a ROM embedded DRAM by any number of programming techniques, including by way of example only and not by way of limitation, hard programming by eliminating cell dielectric to short cell plates to a program voltage, or by fabricating an electrical plug between the cell plates and shorted to a program voltage, programming using an anti-fuse programming technique, or by providing a high leakage path (not full short) such as through an active area to the substrate.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A ROM embedded DRAM, comprising:
a memory array comprising at least a first portion of ROM cells and a second portion of DRAM cells;
wherein the ROM cells comprise a plurality of DRAM cells bard shorted to one ROM bit polarity, and a plurality of regular DRAM cells programmable to an opposite ROM bit polarity.

2. The ROM embedded DRAM of claim 1, wherein the hard shorts comprise:
an electrical plug between cell plates and shorted to a program voltage.

3. The ROM embedded DRAM of claim 1, wherein the hard shorts comprise:
a high leakage path through an active area of the ROM cells to a substrate.

4. The ROM embedded DRAM of claim 1, wherein the hard shorts comprise:
a programmed anti-fuse.

5. A ROM embedded DRAM, comprising:
a DRAM array having a first subarray containing non-volatile bits and a second subarray having volatile bits;
wherein the non-volatile bits of a first polarity are hard shorted to a first non-volatile bit polarity, and wherein the volatile bits of a second, complementary polarity are dynamically programmable as volatile cells to the second polarity.

6. A method of programming ROM cells of a ROM embedded DRAM, comprising:
programming in a non-volatile fashion all ROM cells of one polarity to a first data state; and
programming in a volatile fashion all remaining ROM cells to an opposite data state.

7. The method of claim 6, wherein programming to the first data state comprises physically connecting each ROM cell to a potential corresponding to its polarity.

8. The method of claim 6, wherein blanket programming is accomplished by a DRAM write operation.

9. A method of fabricating a ROM embedded DRAM, comprising:
forming a DRAM array; and
forming non-volatile shorts for specific ROM cells in the DRAM array.

10. A method of operating a ROM embedded DRAM, comprising:
programming all volatile bits of a ROM section of a ROM embedded DRAM with an opposite polarity logic level from a plurality of hard shorted non-volatile bits in the ROM section.

11. A method of operating a ROM embedded DRAM, comprising:
programming in a non-volatile manner a plurality of cells in a ROM portion of the ROM embedded DRAM to a first polarity; and
programming in a volatile programming manner the remaining cells in the ROM portion of the ROM embedded DRAM to a second polarity logically opposite to the first polarity.

12. The method of claim 11, wherein the non-volatile plurality of ROM cells are shorted to logic 1, and the volatile remaining cells are programmed to logic 0.

13. The method of claim 11, wherein the non-volatile programmed ROM bits are all hard shorted to logic 0, and the first polarity represents a bit logic level of 1.

14. A method of programming a ROM portion having a plurality of ROM programmable DRAM cells in a ROM embedded DRAM, comprising:
hard shorting ROM cells of a first polarity to a potential corresponding to the first polarity;
isolating fully hard shorted rows of ROM cells; and
programming the remaining ROM cells to a second polarity with the hard shorted ROM cell rows isolated.

15. The method of claim 14, wherein isolating comprises:
turning on an isolation transistor connected between a ROM cell capacitor ground plate and a supply voltage.

16. The method of claim 15, and further comprising turning off the isolation transistor upon initiation of a read operation for the ROM cells.

17. The method of claim 14, wherein hard shorting comprises:
creating an electrical plug between cell plates; and
shorting the cell plates to a program voltage.

18. The method of claim 14, wherein hard shorting comprises:
creating a high leakage path through an active area of the ROM cells to a substrate.

19. The method of claim 14, wherein hard shorting comprises:
eliminating a cell dielectric to short cell plates to a program voltage.

20. A method of initializing a ROM portion of a ROM embedded DRAM comprising:
hard programming in the ROM section all non-volatile cells of a particular polarity; and
programming remaining volatile cells in the ROM portion of the ROM embedded DRAM to the opposite polarity of the hard programmed non-volatile cells.

21. The method of claim 20, wherein programming the remaining volatile cells comprises initiating a write operation to write the opposite polarity to each cell.

22. The method of claim 20, wherein programming the remaining volatile cells comprises:
initiating a write operation to write the opposite polarity to the ROM portion.

23. A dynamic read only memory (DROM) comprising:
first memory cells programmed in a non-volatile manner to a first data state; and
second memory cells volatilely programmed to a second data state, wherein the second memory cells comprise capacitors.

24. The DROM of claim 23, wherein the first memory cells are formed as capacitors having cell plates shorted to storage nodes.

25. The DROM of claim 23, wherein the first memory cells are formed as capacitors having a storage node shorted to receive a program voltage.

26. The DROM of claim 23, and further comprising program circuitry to dynamically program the second memory cells.

27. The DROM of claim 26, wherein the program circuitry stores a charge on the capacitors.

28. The DROM of claim 26, wherein the program circuitry applies a charge to both the first and the second memory cells.

29. A dynamic read only memory (DROM), comprising:
first memory cells programmed in a non-volatile manner to a first data state;
second memory cells dynamically programmed to a second data state, wherein the second memory cells comprise capacitors;
a plurality of bit lines selectively coupleable to either the first or the second memory cells;
sense amplifier circuitry coupled to the bit lines; and
program circuitry to dynamically program the second memory cells.

30. A memory, comprising:

a RAM array of memory cell capacitors; and a ROM array comprising:

first memory cells programmed in a non-volatile manner to a first data state; and second memory cells dynamically programmed to a second data state, wherein the second memory cells comprise capacitors.

31. A processing system, comprising:

a processor; and a memory coupled to the processor to dynamically store data provided by the processor and to provide non-volatile data to the processor, the memory comprising:

first memory cells programmed in a non-volatile manner to a first data state; and second memory cells dynamically programmed to a second data state, wherein the second memory cells comprise capacitors.

32. A processing system, comprising:

a processor; and a memory coupled to the processor to dynamically store data provided by the processor and to provide non-volatile data to the processor, the memory comprising:

a RAM array of memory cell capacitors; and a ROM array comprising first ROM array memory cells programmed in a non-volatile manner to a first data state;

second ROM array memory cells dynamically programmed to a second data state, wherein the second memory cells comprise capacitors;

a plurality of bit lines selectively coupleable to either the first or the second ROM array memory cells or both;

sense amplifier circuitry coupled to the bit lines; and program circuitry to dynamically program the second ROM array memory cells.

33. A method, comprising:

non-volatilely programming first memory cells to a ground voltage; and dynamically programming second memory cells by storing a charge on a capacitor of the second memory cells.

34. The method of claim 33, wherein dynamically programming comprises applying a charge to the first and to the second memory cells, wherein the first memory cells do not retain the applied charge.

35. The method of claim 33, and further comprising refreshing the first and the second memory cells.

36. The method of claim 35, wherein refreshing comprises:

sensing a data state of each of the second memory cells; and applying a charge representative of the data state of the second memory cells to the first and to the second memory cells, wherein the first memory cells do not retain the applied charge.

37. The method of claim 35, wherein refreshing comprises:

sensing a data state of each of the second memory cells;

isolating fully non-volatilely programmed rows of first memory cells; and applying a charge representative of the data state of the second memory cells to the second memory cells.

* * * * *